(12) United States Patent
Chikaoka

(10) Patent No.: US 12,007,556 B2
(45) Date of Patent: Jun. 11, 2024

(54) LIGHT DEFLECTION DEVICE

(71) Applicant: STANLEY ELECTRIC CO., LTD., Tokyo (JP)

(72) Inventor: Atsuhiko Chikaoka, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 699 days.

(21) Appl. No.: 17/226,242

(22) Filed: Apr. 9, 2021

(65) Prior Publication Data

US 2021/0333542 A1   Oct. 28, 2021

(30) Foreign Application Priority Data

Apr. 22, 2020   (JP) ................. 2020-076083

(51) Int. Cl.
| | | |
|---|---|---|
| *G02B 26/10* | (2006.01) | |
| *B81B 3/00* | (2006.01) | |
| *B81B 7/00* | (2006.01) | |
| *B81B 7/02* | (2006.01) | |
| *G02B 26/08* | (2006.01) | |

(52) U.S. Cl.
CPC .......... *G02B 26/101* (2013.01); *B81B 3/0021* (2013.01); *B81B 3/0045* (2013.01); *B81B 3/0062* (2013.01); *B81B 7/008* (2013.01); *B81B 7/02* (2013.01); *G02B 26/0858* (2013.01); *B81B 2201/042* (2013.01)

(58) Field of Classification Search
CPC .......................... H10N 30/20; H10N 30/2027
See application file for complete search history.

(56) References Cited

U.S. PATENT DOCUMENTS

| | | | | |
|---|---|---|---|---|
| 2010/0245966 A1* | 9/2010 | Yasuda | ............. | G02B 26/0858 |
| | | | | 359/224.1 |
| 2011/0080069 A1* | 4/2011 | Cueff | ................... | H10N 30/06 |
| | | | | 29/25.35 |
| 2013/0083378 A1 | 4/2013 | Tanaka et al. | | |
| 2015/0062683 A1* | 3/2015 | Akanuma | ......... | G02B 26/0858 |
| | | | | 359/224.1 |
| 2015/0124304 A1 | 5/2015 | Tanaka et al. | | |
| 2016/0109074 A1* | 4/2016 | Hirasawa | ............... | F21S 41/30 |
| | | | | 362/509 |
| 2017/0005257 A1* | 1/2017 | Uchino | ................ | H10N 30/87 |
| 2019/0187459 A1* | 6/2019 | Matsumaru | .......... | G01J 1/0295 |

FOREIGN PATENT DOCUMENTS

JP              5987510 B2       8/2016

* cited by examiner

*Primary Examiner* — Bryan P Gordon
(74) *Attorney, Agent, or Firm* — Holtz, Holtz & Volek PC

(57) ABSTRACT

An light deflection device includes an light deflector having first and second piezoelectric actuators which cause a mirror unit to reciprocatingly turn around a resonant axis and a non-resonant axis, respectively, a drive unit which supplies first and second drive voltages, a swing angle fluctuation width detection unit which detects a first swing angle fluctuation width of the mirror unit around the resonant axis, a sensitivity equivalent value detection unit which detects a sensitivity equivalent value on the basis of a detected value of a second drive voltage fluctuation width and a detected value of the first swing angle fluctuation width, and a determination unit which determines whether a non-resonant axis side swing state of the mirror unit around the non-resonant axis is normal on the basis of a detected value of the sensitivity equivalent value.

8 Claims, 11 Drawing Sheets

FIG.10
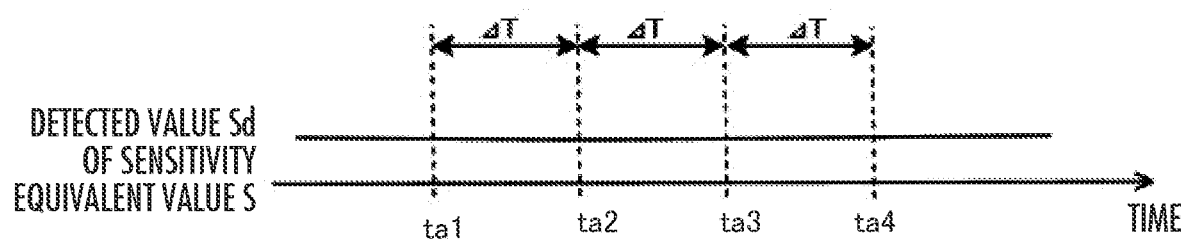
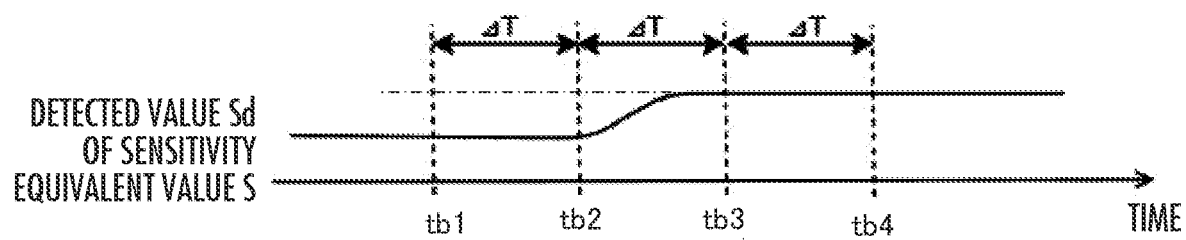

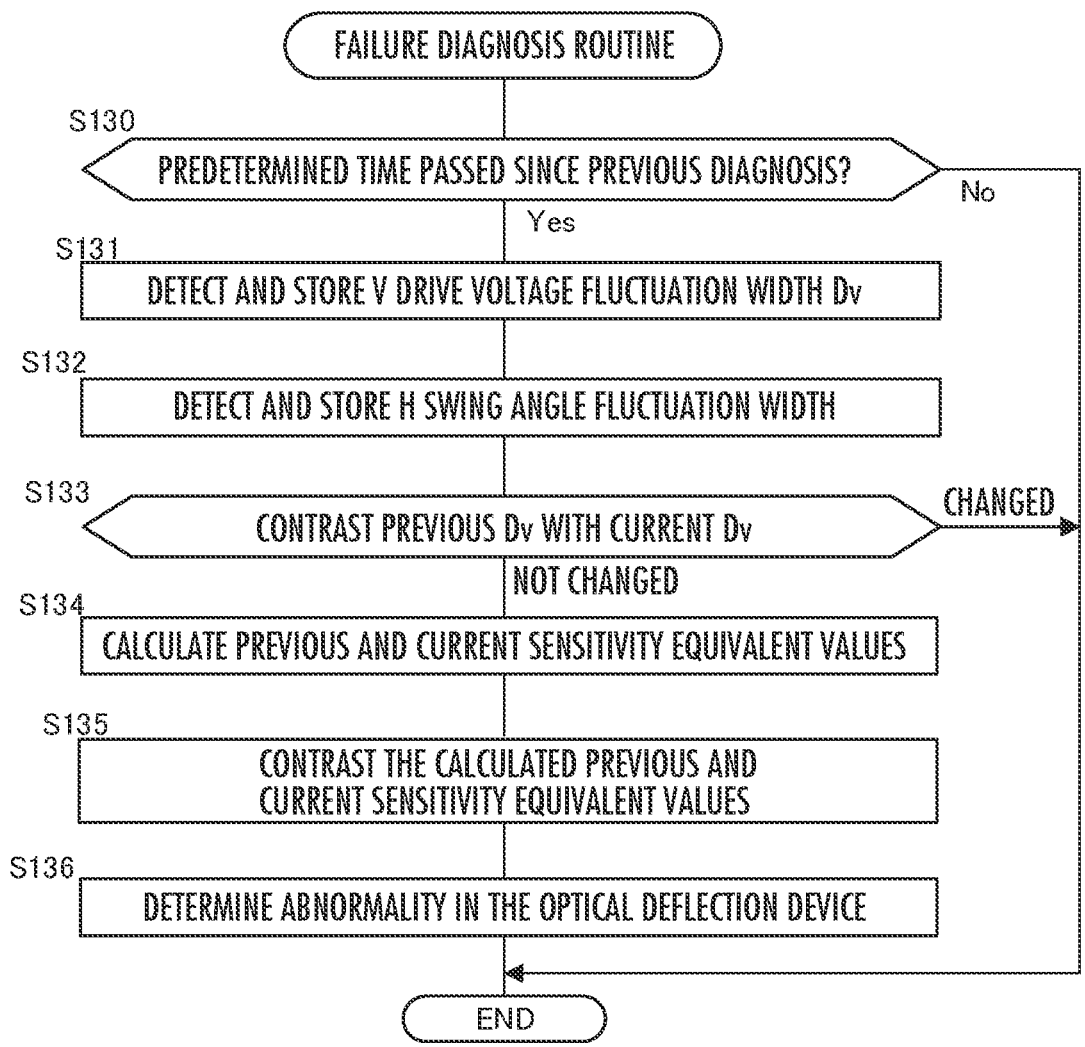

LIGHT DEFLECTION DEVICE

BACKGROUND OF THE INVENTION

1. Field of the Invention

The present invention relates to an light deflection device equipped with a two-axis scanning type light deflector.

2. Description of the Related Art

In an light deflection device equipped with a two-axis scanning type MEMS (Micro Electro Mechanical System) light deflector, a mirror unit of the light deflector is caused to reciprocate around each of axes that are in an intersecting relationship, to emit scanning light scanning in two axes from the mirror unit (Patent Literature 1). In such an light deflection device, it is necessary to monitor abnormalities in the reciprocating turning of the mirror unit around each axis during operation.

SUMMARY OF THE INVENTION

In the light deflection device of Patent Literature 1, the swing angle around each axis of the mirror unit is detected by a swing angle sensor provided for each axis.

PATENT LITERATURE

Patent Literature 1: Japanese Patent No. 5987510

The light deflection device of Patent Literature 1 requires as many swing angle sensors as the number of axes. The light deflection device thus becomes more complicated, larger, and more costly.

It is an object of the present invention to provide an light deflection device capable of using a swing angle of the mirror unit around one axis to determine a swing state of the mirror unit around another axis.

The inventors of the present invention have found that when the mirror unit of the light deflector is caused to reciprocatingly turn around two axes of resonant axis and non-resonant axis that are in an intersecting relationship, even in the case where the drive voltage of the piezoelectric actuator on the resonant axis side of the mirror unit is kept constant, the reciprocating turning width of the swing angle of the mirror unit around the resonant axis varies depending on the reciprocating turning width around the non-resonant axis.

On the basis of the above findings, the light deflection device of the present invention detects a fluctuation width of the drive voltage of the piezoelectric actuator on the non-resonant axis side during the period in which the drive voltage of the piezoelectric actuator on the resonant axis side is maintained constant, and determines the swing state of the mirror unit around the non-resonant axis on the basis of a relationship between the detected fluctuation width and a detected value of a fluctuation width of the swing angle of the mirror unit around the resonant axis.

An light deflection device of the present invention includes:
an light deflector having a mirror unit, a first piezoelectric actuator configured to cause the mirror unit to reciprocatingly turn around a first axis resonantly, and a second piezoelectric actuator configured to cause the mirror unit to reciprocatingly turn around a second axis non-resonantly, the second axis being in an intersecting relationship with the first axis;
a drive unit configured to supply a first drive voltage and a second drive voltage to the first piezoelectric actuator and the second piezoelectric actuator, respectively, of the light deflector;
a voltage fluctuation width detection unit configured to detect a second drive voltage fluctuation width;
a swing angle fluctuation width detection unit configured to detect a first swing angle fluctuation width as a fluctuation width of a swing angle of the mirror unit around the first axis;
a sensitivity equivalent value detection unit configured to detect a sensitivity equivalent value on the basis of a detected value of the second drive voltage fluctuation width and a detected value of the first swing angle fluctuation width, the sensitivity equivalent value being a ratio of the first swing angle fluctuation width to the second drive voltage fluctuation width; and
a determination unit configured to determine whether a second axis side swing state of the mirror unit around the second axis is normal, on the basis of a detected value of the sensitivity equivalent value.

According to the present invention, the determination as to whether the swing state on the second axis side is normal is made on the basis of a detected value of the sensitivity equivalent value that is calculated on the basis of the swing angle fluctuation width on the first axis side. It is thus possible to determine whether the swing state on the second axis side is normal by omitting the detection of the swing angle on the second axis side.

Preferably, in the light deflection device of the present invention,
the determination unit includes
a data holding unit which holds data that defines a rated relationship between the second drive voltage fluctuation width and a rated value of the sensitivity equivalent value, and
a calculation determination unit configured to calculate a corresponding rated value of the sensitivity equivalent value corresponding to a detected value of the second drive voltage fluctuation width on the basis of the rated relationship, and determine the second axis side swing state on the basis of a contrast between the detected value of the sensitivity equivalent value and the corresponding rated value of the sensitivity equivalent value.

According to this configuration, the swing state on the second axis side can be determined accurately on the basis of the contrast between the detected value and the corresponding rated value of the sensitivity equivalent value.

Preferably, in the light deflection device of the present invention,
with first and second conditions being set as conditions that cause the light deflector to operate with mutually different fluctuation widths Vw1 and Vw2, respectively, of the second drive voltage fluctuation width,
the calculation determination unit performs the contrast, using a detected value Sd1 of the sensitivity equivalent value under the first condition and a corresponding rated value Sr1 corresponding to the fluctuation width Vw1, and a detected value Sd2 of the sensitivity equivalent value under the second condition and a corresponding rated value Sr2 corresponding to the fluctuation width Vw2, by contrasting a relative relationship between the detected value Sd1 and the detected value Sd2 with a relative relationship between the corresponding rated value Sr1 and the corresponding rated value Sr2.

According to this configuration, the swing state on the second axis side can be determined accurately on the basis of the contrast between the detected values and the corresponding rated values of the sensitivity equivalent values under two conditions of the first and second conditions.

Preferably, in the light deflection device of the present invention, the calculation determination unit performs the contrast between the relative relationships by contrasting a ratio of Sd1 to Sd2 with a ratio of Sr1 to Sr2.

According to this configuration, the swing state on the second axis side can be determined accurately by using the ratio as the relative relationship.

Preferably, in the light deflection device of the present invention, the calculation determination unit performs the contrast between the relative relationships by contrasting a difference between Sd1 and Sd2 with a difference between Sr1 and Sr2.

According to this configuration, the swing state on the second axis side can be determined accurately by using the difference as the relative relationship.

Preferably, in the light deflection device of the present invention, the fluctuation width Vw1 under the first condition is a non-customizable second axis side voltage fluctuation width at the time of startup of the light deflector, and the fluctuation width Vw2 under the second condition is a customizable second axis side voltage fluctuation width changed at a first change after the startup.

According to this configuration, setting the appropriate first and second conditions can improve the accuracy of the contrast between the detected value and the corresponding rated value of the sensitivity equivalent value.

Preferably, in the light deflection device of the present invention, the fluctuation width Vw1 under the first condition and the fluctuation width Vw2 under the second condition are the second drive voltage fluctuation widths before and after the second drive voltage fluctuation width is changed while a first drive voltage fluctuation width as a fluctuation width of the first drive voltage is maintained.

According to this configuration, setting the appropriate first and second conditions can improve the accuracy of the contrast between the detected value and the corresponding rated value of the sensitivity equivalent value.

Preferably, in the light deflection device of the present invention, the determination unit determines that the swing angle fluctuation width detection unit is in a failure state in the case where the detected value of the sensitivity equivalent value has changed by more than a predetermined threshold value during a period in which the second drive voltage fluctuation width is kept constant.

According to this configuration, during the period in which the second drive voltage fluctuation width is maintained constant, the failure state of the swing angle fluctuation width detection unit, which detects the fluctuation width of the swing angle of the mirror unit around the first axis, can be determined on the basis of the detected value of the sensitivity equivalent value.

BRIEF DESCRIPTION OF THE DRAWINGS

FIG. 10 illustrates failure diagnosis of the light deflection device performed on the basis of the detected value of the sensitivity equivalent value;
and
FIG. 11 is a flowchart of a method of failure diagnosis during a period in which the V drive voltage fluctuation width is unchanged.

DESCRIPTION OF THE PREFERRED EMBODIMENTS

Figure 1:
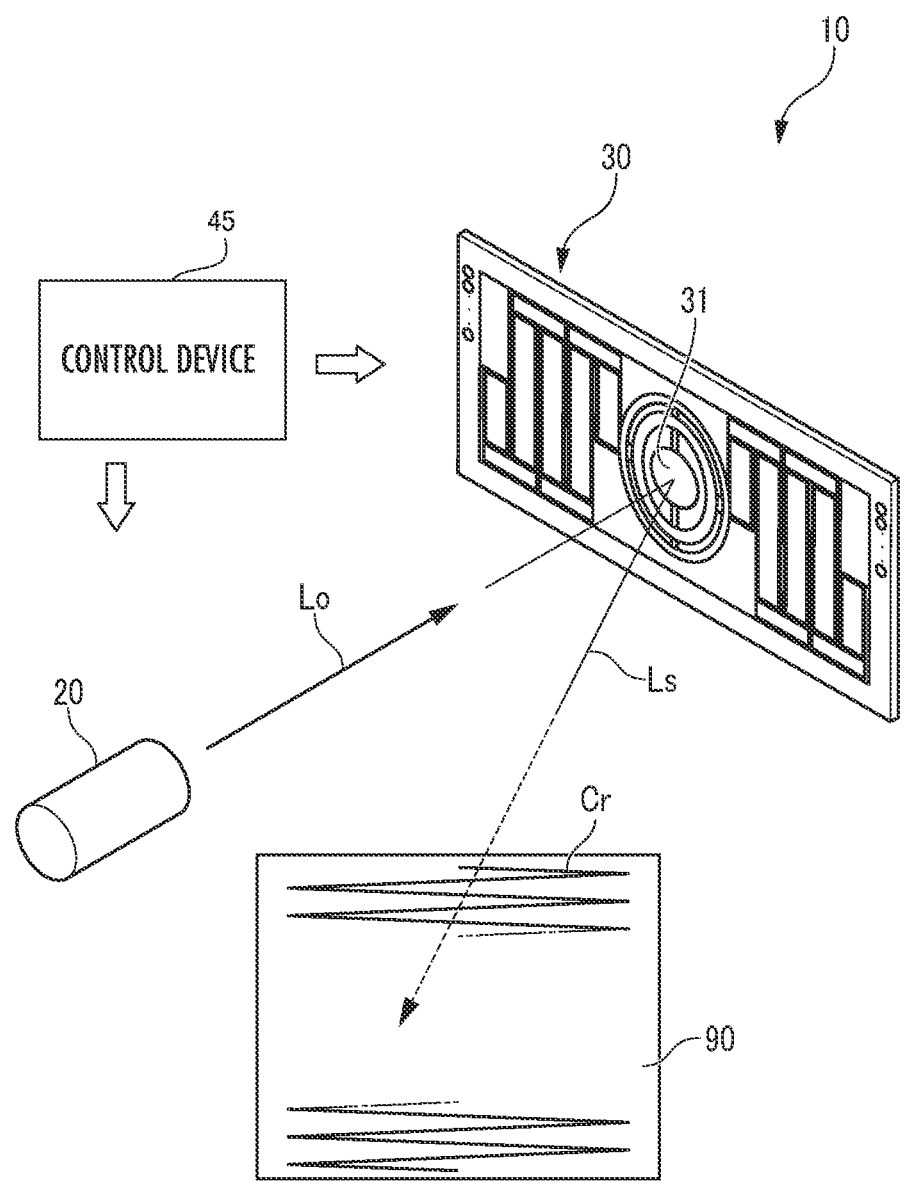
FIG. 1 is an overall schematic diagram of an light deflection device.

A preferred embodiment of the present invention will be described below. It goes without saying that the present invention is not limited to the following embodiment.

The present invention may be implemented in various forms within the scope of the technical idea disclosed herein. In the drawings, common components are denoted by the same symbols.

(Optical Deflection Device/Entirety)

FIG. 1 is an overall schematic diagram of an light deflection device 10. The light deflection device 10 includes a laser light source 20, an light deflector 30, and a control device 45.

Although a screen 90 is illustrated in FIG. 1, the screen 90 is excluded from the components constituting the light deflection device 10. The screen 90 is only illustrated for the convenience of explaining a scanning trajectory Cr by a scanning light beam Ls generated by the light deflection device 10. The screen 90 may be a video screen or an irradiated area in front of a vehicle, depending on the product such as a video device or a vehicle front light in which the light deflection device 10 is incorporated.

The screen 90 has its longitudinal and lateral directions corresponding to the vertical (V) and horizontal (H) directions, respectively. In the following embodiment, components or factors with V or H in their names mean the components or factors related to the vertical or horizontal direction, respectively.

The laser light source 20 emits a laser light beam Lo toward a mirror unit 31 of the light deflector 30. The mirror unit 31 reflects the laser light beam Lo and emits the generated scanning light beam Ls.

The mirror unit 31 reciprocatingly turns around two axes of a first axis and a second axis resonantly and non-resonantly, respectively. The first axis (hereinafter, referred to as "resonant axis" or "H axis" as appropriate) and the second axis (hereinafter, referred to as "non-resonant axis" or "V axis" as appropriate) are in an orthogonal relationship. The scanning light beam Ls generates a scanning trajectory Cr in raster scanning on the screen 90.

The control device 45 controls drive voltages of an H actuator 33 and a V actuator 35 (FIG. 2) of the light deflector 30. The control device 45 can further control the switching on and off of the laser light source 20 and the luminous intensity of the laser light beam Lo when the laser light source 20 is on.

(Optical Deflector)

Figure 2:
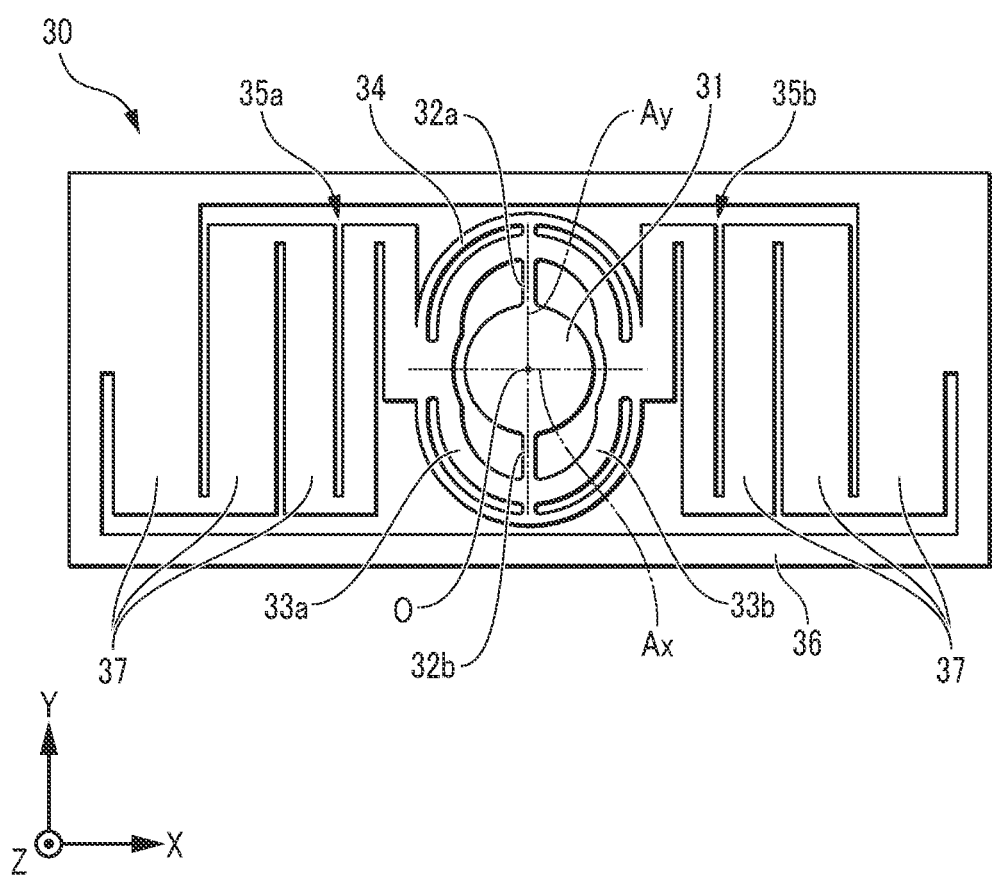
FIG. 2 is a front view of an light deflector.

FIG. 2 is a front view of the light deflector 30. For convenience in explaining the configuration of the light deflector 30, a three-axis coordinate system is defined. The X and Y axes are parallel to the horizontal and vertical directions, respectively, in the front view of the light deflector 30. The Z axis is parallel to the thickness direction of the MEMS light deflector 30.

The light deflector 30 includes the mirror unit 31, torsion bars 32a and 32b, H actuators 33a and 33b, a movable frame 34, V actuators 35a and 35b, and a fixed frame 36.

The mirror unit 31 is circular, and the laser light beam Lo (FIG. 1) is incident on the center O of the mirror unit 31. The torsion bars 32a and 32b extend from the mirror unit 31 on mutually opposite sides in the Y axis direction and have their distal ends joined to the inner circumference of the movable frame 34. The H actuators 33a and 33b are located on both sides in the X axis direction relative to the mirror unit 31 and have their both ends in the Y axis direction joined to a middle portion of the torsion bar 32 (collective term for the torsion bars 32a and 32b). The H actuator 33 (collective term for the H actuators 33a and 33b) is located on the outer peripheral side of the mirror unit 31 and on the inner peripheral side of the movable frame 34.

The H actuators 33a and 33b are supplied with H drive voltages (first drive voltages) with the same amplitude and frequency and with their phases shifted by 180°. The frequency is set to a resonant frequency (e.g., 1.5 kHz). This causes the mirror unit 31 to reciprocatingly turn around the central axis (first axis or resonant axis) of the torsion bar 32 resonantly.

The V actuators 35a and 35b are located on both sides with respect to the movable frame 34 in the X axis direction. Each V actuator 35 (collective term for the V actuators 35a and 35b) is interposed between the outer circumference of the movable frame 34 and the inner circumference of the fixed frame 36. Each V actuator 35 has a plurality of cantilevers 37 that are coupled in series parallel to the Y axis direction and in a meander array.

When the plurality of cantilevers 37 in each V actuator 35 are numbered in order in the X axis direction from the outside (inner peripheral side of the fixed frame 36) to the inside (outer peripheral side of the movable frame 34), the odd-numbered cantilevers 37 and the even-numbered cantilevers 37 are supplied with V drive voltages (second drive voltages) with the same amplitude and frequency and with their phases shifted by 180°.

The frequency of the V drive voltage is set to a non-resonant frequency (e.g., 60 Hz), which is much lower than the resonant frequency of the reciprocating turning of the mirror unit 31 around the first axis. This causes the mirror unit 31 to reciprocatingly turn around the second axis (non-resonant axis) non-resonantly. The second axis is parallel to the X axis and passes through the center O of the mirror unit 31.

(Control Device/Configuration)

Figure 3:
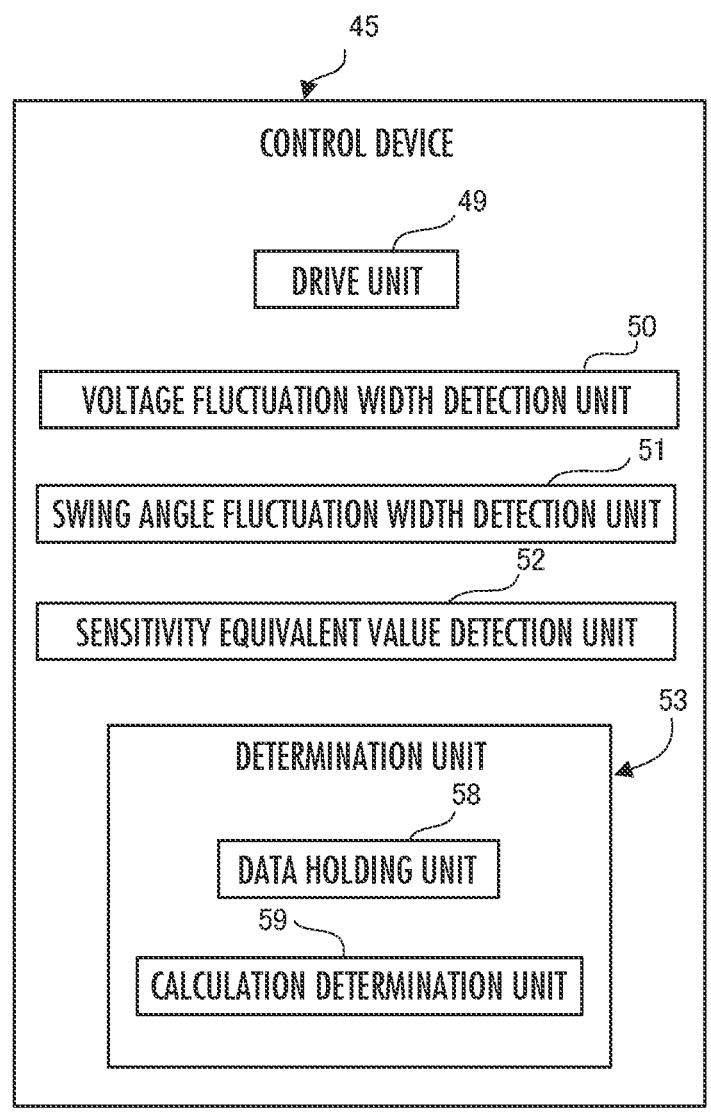
FIG. 3 is a block diagram of a control device.

FIG. 3 is a block diagram of the control device 45. The control device 45 includes a drive unit 49, a voltage fluctuation width detection unit 50, a swing angle fluctuation width detection unit 51, a sensitivity equivalent value detection unit 52, and a determination unit 53. The determination unit 53 further includes a data holding unit 58 and a calculation determination unit 59. The detailed action of the control device 45 will be described later.

Figure 4:
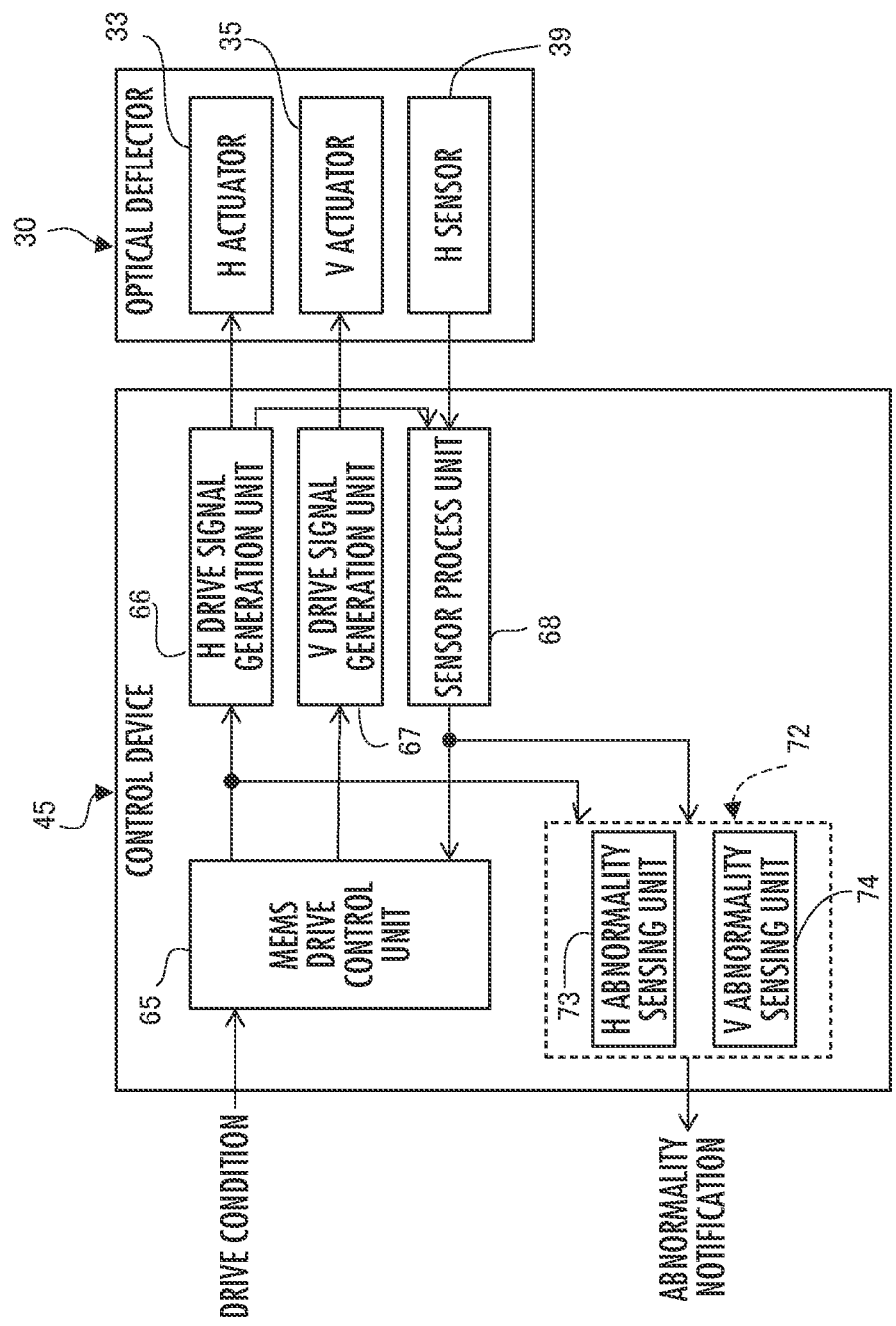
FIG. 4 is a specific circuit diagram of the light deflector and the control device.

FIG. 4 is a specific circuit diagram of the light deflector 30 and the control device 45. The light deflector 30 includes an H sensor 39 in addition to the H actuator 33 and the V actuator 35. The H sensor 39 is created, for example at the joint of the torsion bar 32 and the V actuator 35, by utilizing a part of a piezoelectric film layer commonly formed on the H actuator 33 and the V actuator 35 during the production of the light deflector 30. In other words, the H sensor 39 is built in the light deflector 30.

The control device 45 includes a MEMS drive control unit 65, an H drive signal generation unit 66, a V drive signal generation unit 67, a sensor process unit 68, and an abnormality determination unit 72. The abnormality determination unit 72 further includes an H abnormality sensing unit 73 and a V abnormality sensing unit 74.

The correspondence between the blocks in FIG. 3 and the blocks in FIG. 4 is as follows.

Drive unit 49: MEMS drive control unit 65, H drive signal generation unit 66, and V drive signal generation unit 67.

Voltage fluctuation width detection unit 50, swing angle fluctuation width detection unit 51, sensitivity equivalent value detection unit 52, and determination unit 53: sensor process unit 68 and abnormality determination unit 72.

The MEMS drive control unit 65 outputs control signals to the H drive signal generation unit 66, the V drive signal generation unit 67, and the abnormality determination unit 72. The MEMS drive control unit 65 receives drive conditions (conditions for the H drive voltage and V drive voltage) from outside the control device 45. The H drive signal generation unit 66 and the V drive signal generation unit 67 output the H drive voltage (the first drive voltage) and the V drive voltage (the second drive voltage) to the H actuator 33 and the V actuator 35, respectively.

The sensor process unit 68, on the basis of the input signals from the H sensor 39 and the H drive signal generation unit 66, generates a signal pertaining to a sensitivity equivalent value, and outputs the generated signal to the MEMS drive control unit 65 and the abnormality determination unit 72. The H abnormality sensing unit 73 and the V abnormality sensing unit 74 sense abnormalities in the swing angles in the H direction and the V direction, respectively, of the mirror unit 31. These abnormalities are output as abnormality notifications to a speaker or a display outside the control device 45.

(Sensitivity Equivalent Value)

Figure 5:
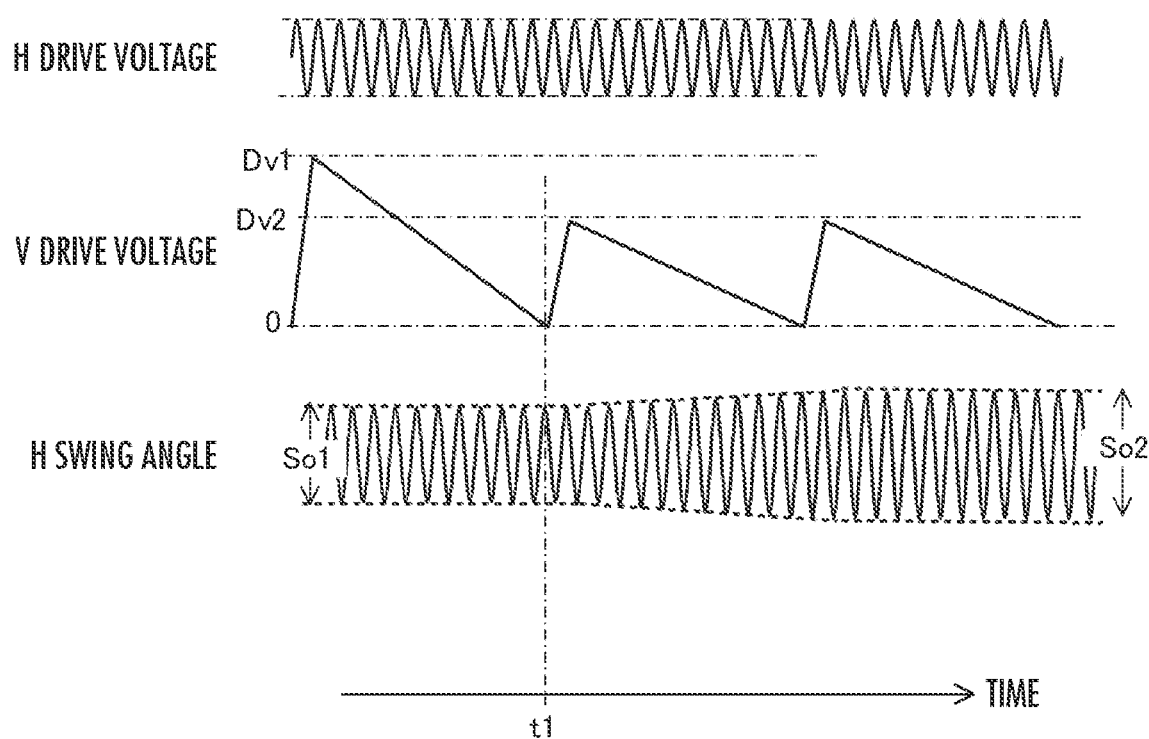
FIG. 5 shows changes over time of H drive voltage, V drive voltage, and an H sensor output.

FIG. 5 shows changes over time of H drive voltage (drive voltage of the H actuator 33), V drive voltage (drive voltage of the V actuator 35), and H swing angle. The H swing angle indicates the swing angle of the mirror unit 31 around the first axis detected by the H sensor 39.

According to the general knowledge of those skilled in the art, if the fluctuation width of the H drive voltage is constant, the fluctuation width of the H swing angle is constant regardless of the fluctuation width of the V drive voltage. However, the present inventors have found that even if the fluctuation width of the H drive voltage remains unchanged, the fluctuation width of the H swing angle changes with the change in the fluctuation width of the V drive voltage.

The inventors consider the reasons for this as follows.
(a) As the V drive voltage fluctuation width of the cantilevers 37 increases, the stiffness of the cantilevers 37 increases, and the efficiency of the H drive voltage decreases accordingly.
(b) When the V swing angle of the mirror unit 31 is large, the stiffness of the mirror unit 31 increases compared to when it is small, and the efficiency of the H drive voltage decreases accordingly.

It is considered from the above findings that the V swing angle fluctuation width can be detected from the H swing angle fluctuation width when the fluctuation width of the H drive voltage is constant. This means that it is possible to determine whether the swing state on the second axis side is normal or abnormal from the H swing angle fluctuation width.

It should be noted that the fluctuation width is a difference between a maximum value and a minimum value (peak to peak) of a value, which differs from an amplitude (a maximum absolute value on the positive or negative side). In the light deflector 30, the H actuator 33 and the V actuator 35 are driven in unipolar fashion, and the H drive voltage and the V drive voltage are kept either positive or negative.

In the embodiment of FIG. 5, the drive voltage of the mirror unit 31 has a sinusoidal waveform, and the drive voltage of the V actuator 35 has a sawtooth waveform. Since the minimum value of the waveform of the V drive voltage is zero, the maximum value of the waveform means the fluctuation width.

The H drive voltage fluctuation width of the H actuator 33 remains unchanged. In contrast, the V drive voltage fluctuation width of the V actuator 35 changes from Dv1 to Dv2 (<Dv1) at time t1. The fluctuation width of the H swing angle changes from So1 to So2 (>So1) with the change of the V drive voltage fluctuation width from Dv1 to Dv2.

Here, Dv1 and Dv2 are the V drive voltage fluctuation widths of the V actuator 35. The V swing angle fluctuation width of the mirror unit 31 increases with increasing V drive voltage fluctuation width.

Figure 6:
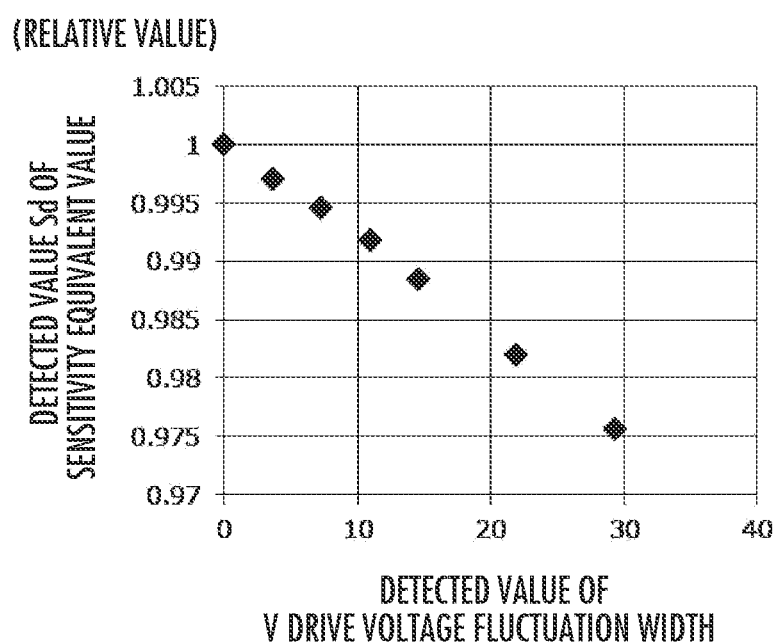
FIG. 6 is a graph examining a relationship between a detected value of V drive voltage fluctuation width and a detected value of sensitivity equivalent value.

FIG. 6 is a graph examining a relationship between a detected value of V drive voltage fluctuation width and a detected value Sd of sensitivity equivalent value. Since the H actuator 33 and the V actuator 35 are unipolar, the maximum value of the V drive voltage coincides with the V drive voltage fluctuation width. In the light deflection device 10, the minimum value of the V drive voltage is zero, so the detected value of the V drive voltage fluctuation width is also the maximum value of the V drive voltage.

The sensitivity equivalent value S applied to the embodiment is defined as an H swing angle fluctuation width with respect to a V drive voltage fluctuation width, as shown in Expression 1 below, under the condition that the H drive voltage fluctuation width is unchanged.

Sensitivity equivalent value $S = H$ swing angle fluctuation width/$V$ drive voltage fluctuation width (Expression 1)

It should be noted that the sensitivity equivalent value S changes as the H drive voltage fluctuation width changes. Thus, the sensitivity equivalent value S in the Expression 1 becomes a function of the H drive voltage. The H swing angle fluctuation width can be calculated from an output of the H sensor 39. The V drive voltage fluctuation width can be calculated from an output of the V drive signal generation unit 67.

Figure 7:
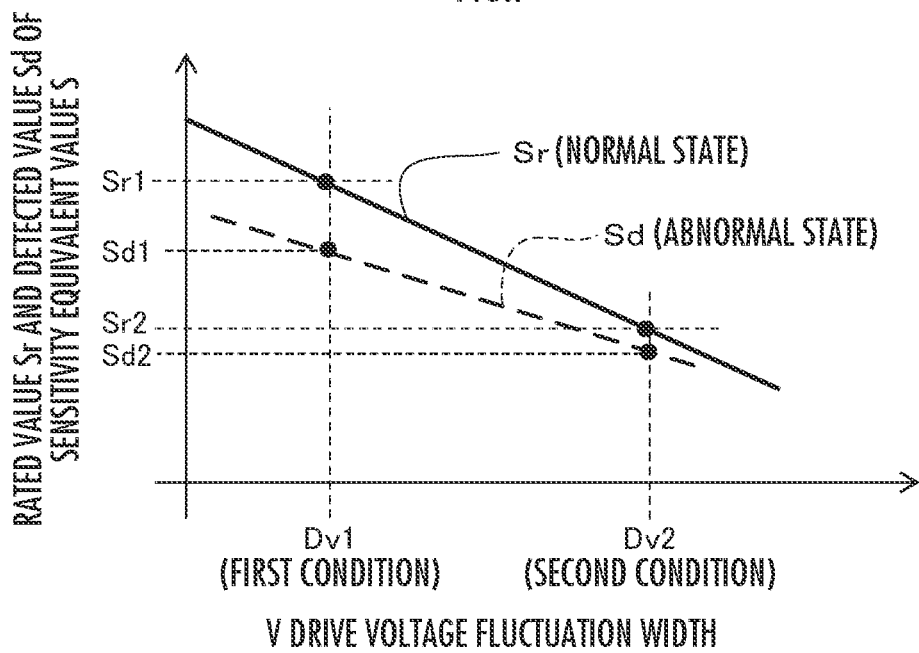
FIG. 7 is a graph showing relationships between V drive voltage and rated and detected values of sensitivity equivalent value at a given H drive voltage.

FIG. 7 is a graph showing relationships between V drive voltage fluctuation width and a rated value Sr and a detected value Sd of sensitivity equivalent value S at a given H drive voltage. For the light deflector 30, a designer sets the relationship between the V drive voltage fluctuation width and the rated value Sr in advance as a rated relationship (relationship in normal operation). The data pertaining to the rated relationship is held in the data holding unit 58 of the determination unit 53, and the determination unit 53 can refer to the data as appropriate.

On the other hand, in the light deflector 30, abnormalities may occur in the swing state of the mirror unit 31 around the V axis due to various causes. The dashed line in FIG. 7 shows an example of the relationship in such an abnormal state, which deviates greatly from the solid line.

Sr1 and Sr2 are the rated values Sr of the sensitivity equivalent value S corresponding to the V drive voltage fluctuation width Dv=Dv1 and Dv2, respectively. Sd1 and Sd2 are the sensitivity equivalent values S obtained by applying the detected value of the V drive voltage fluctuation width and the detected value of the H swing angle fluctuation width to the Expression 1. When the V drive voltage fluctuation width Dv=Dv1, Dv2, the sensitivity equivalent value S becomes Sd1, Sd2.

(Action)

Figure 8:
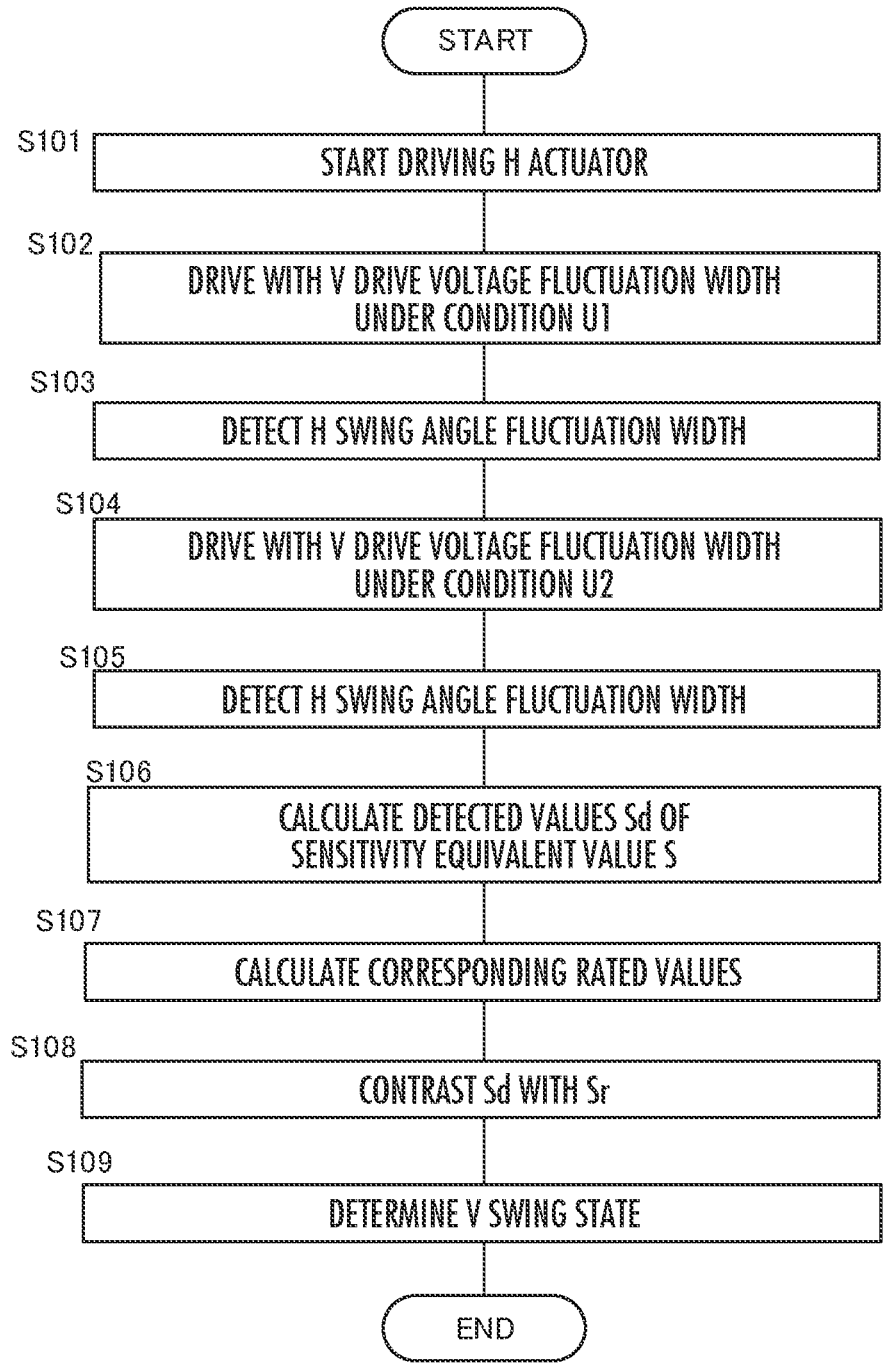
FIG. 8 is a flowchart of a method of determining an abnormality in a V swing state at the time of startup of the light deflection device.

FIG. 8 is a flowchart of a method of determining an abnormality in a V swing state at the time of startup of the light deflection device 10.

In S101, the drive unit 49 starts driving the H actuator 33. In S102, the drive unit 49 drives the V actuator 35 under a condition U1. The condition U1 means that, after the H actuator 33 and the V actuator 35 start, the V actuator 35 is supplied to the first V drive voltage with a fluctuation width Vw1. The V drive voltage fluctuation width Vw1 is a value set by the designer, i.e., a fixed (non-customizable) value that cannot be set by the user.

In S103, the swing angle fluctuation width detection unit 51 (H sensor 39 and sensor process unit 68) detects the H swing angle fluctuation width.

In S104, the drive unit 49 drives the V actuator 35 under a condition U2. The condition U2 applies a V drive voltage fluctuation width, Vw2, that differs from that in the condition U1. The V drive voltage fluctuation width Vw2 is a (customizable) value set by the user and can be changed.

The conditions U1 and U2 correspond to the first and second conditions in FIG. 7, for example. The V drive voltage fluctuation widths of the conditions U1 and U2 correspond to Dv1 and Dv2, for example.

In S105, the swing angle fluctuation width detection unit 51 detects the H swing angle fluctuation width, in the same manner as in S103.

In S106, the sensitivity equivalent value detection unit 52 calculates detected values Sd of the sensitivity equivalent value S. The detected values Sd correspond to Sd1 and Sd2 in FIG. 7, for example. Sd1 can be calculated by substituting Dv1, which can be grasped from the V drive voltage fluctuation width in S102, and the H swing angle fluctuation width detected in S103 into the Expression 1. Sd2 can be calculated by substituting Dv2, which can be grasped from the V drive voltage fluctuation width in S104, and the H swing angle fluctuation width detected in S105 into the Expression 1.

In S107, the calculation determination unit 59 calculates rated values Sr of the sensitivity equivalent value S corresponding to the conditions U1 and U2. The rated values Sr correspond to Sr0 and Sr2 in FIG. 7, for example.

The calculation determination unit 59 calculates corresponding rated values Sr1 and Sr2, as the rated values Sr corresponding to Dv1 and Dv2, by referring to the data held in the data holding unit 58 that specifies the rated relationship. For this calculation, an interpolation method is used.

In S108, the calculation determination unit 59 contrasts the detected values Sd with the rated values Sr. Specifically, a ratio of the corresponding rated value Sr1 to the corresponding rated value Sr2 is contrasted with a ratio of the detected value Sd1 to the detected value Sd2.

In S109, the calculation determination unit 59 determines the V swing state of the mirror unit 31 on the basis of the contrast in S108. Specifically, the V swing state is determined to be normal when the condition of the following Expression 2 is satisfied: otherwise, it is determined to be abnormal. In the Expression 2, Cth1 is a positive number as a threshold value, and |numerical value| means an absolute value of the numerical value.

$$|Sd1/Sd2 - Sr1/Sr2| \leq Cth1 \quad \text{(Expression 2)}$$

Figure 9:
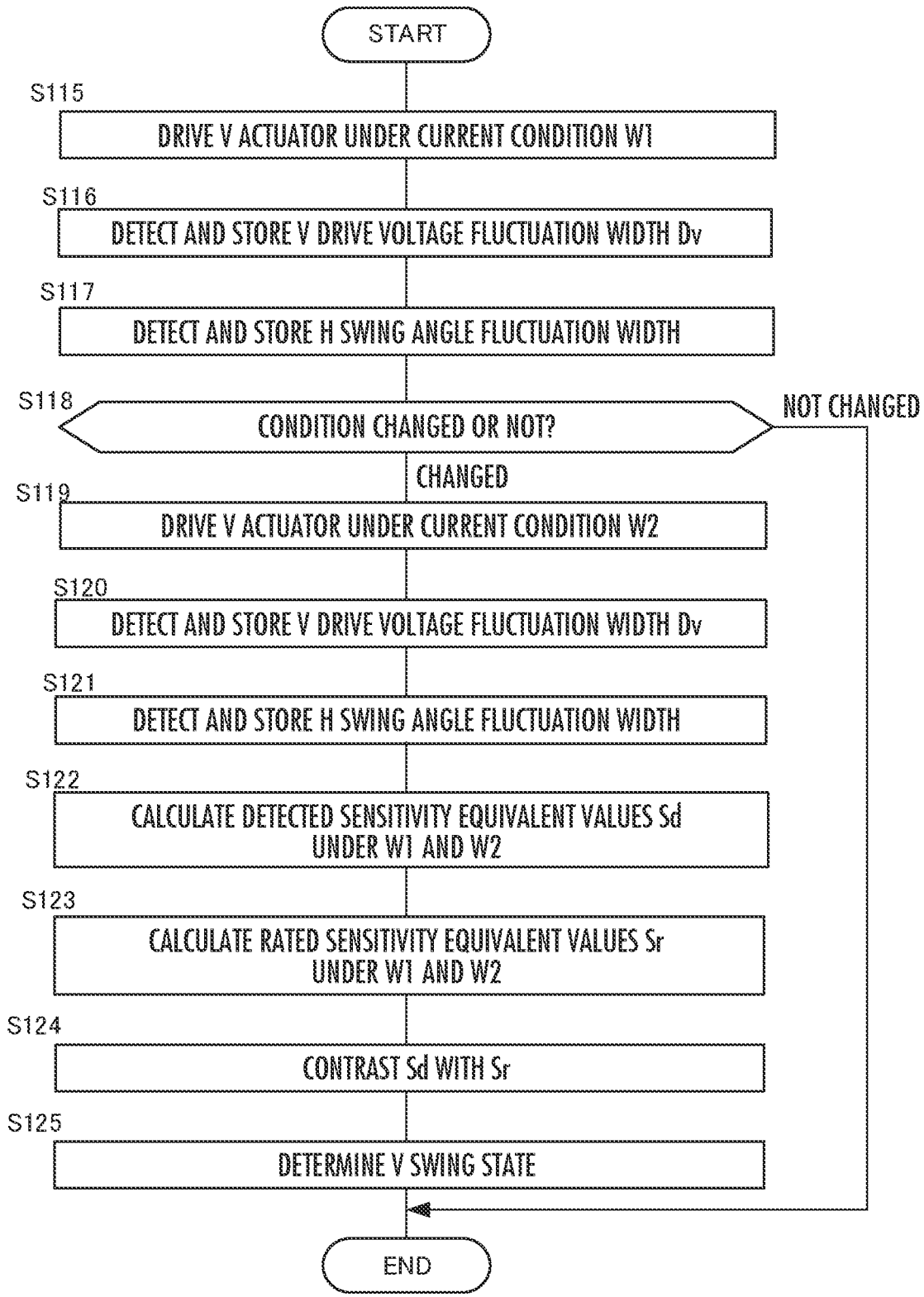
FIG. 9 is a flowchart of a method of determining an abnormality in the V swing state when the V drive voltage fluctuation width is changed during operation of the light deflection device.

FIG. 9 is a flowchart of a method of determining an abnormality in the V swing state when the V drive voltage fluctuation width is changed during the operation of the light deflection device 10.

In S115, the drive unit 49 drives the V actuator 35 under the current condition W1. It should be noted that while the condition W1 in S115 and the condition W2 in S119 are both described as a current condition even though W1≠W2, the term "current" is used to mean the time of execution of each process step.

In S116, the voltage fluctuation width detection unit 50 detects and stores the V drive voltage fluctuation width Dv. In S117, the swing angle fluctuation width detection unit 51 detects and stores the H swing angle fluctuation width.

In S118, the drive unit 49 determines whether the condition has changed from the condition W1 to a condition W2 that is different from the condition W1. The conditions W1 and W2 correspond to the first and second conditions in FIG. 7, for example, and the V drive voltage fluctuation widths are Dv1 and Dv2 in FIG. 7, respectively.

If the drive unit 49 determines that the condition has changed in the determination in S118, the process proceeds to S119. If it is determined that the condition has not changed, the process is terminated. Supplementally, that the condition has changed means that the V drive voltage fluctuation width has changed by a predetermined threshold value or more.

In S119, the drive unit 49 drives the V actuator 35 under the condition W2 of the operating period.

In S120, the voltage fluctuation width detection unit 50 detects and stores the V drive voltage fluctuation width Dv in the same manner as in S116.

In S121, the swing angle fluctuation width detection unit 51 detects and stores the H swing angle fluctuation width in the same manner as in S117.

In S122 and S123, the processing of the same contents as in S106 and S107 described above in conjunction with FIG. 8 is performed.

The calculation determination unit 59 contrasts the detected values Sd with the rated values Sr in S124, and determines the V swing state in S125. The specific ways of contrasting and determination are identical to those described in conjunction with S108 and S109 of FIG. 8. Alternatively, a threshold value Cth2 (≠Cth1) different from the threshold value Cth1 in the Expression 2 described above can also be set.

FIG. 10 illustrates a case of performing failure diagnosis of the light deflection device 10 on the basis of the detected value Sd of the sensitivity equivalent value S. In the case of FIG. 10, a period during which there is no change in the V drive voltage fluctuation width Dv of the V actuator 35 is selected. The temporal change of the detected value Sd shown in the upper part of FIG. 10 is that of when the light deflection device 10 is operating normally. On the other hand, the temporal change shown in the lower part is that of when the light deflection device 10 has a failure.

The failure diagnosis is performed every time a certain period of time ΔT elapses. The failure diagnosis is performed at times ta1, ta2, ta3, and ta4. When the H sensor 39 is operating normally, the detected value Sd does not change, as shown in the upper part of FIG. 10.

In contrast, when a failure such as disconnection occurs in the H sensor 39, the detected value Sd changes even though there are no changes in the V drive voltage fluctuation width and H drive voltage fluctuation width. In the lower part of FIG. 10, the detected value Sd changes by a predetermined threshold value or more during times tb2 to tb3. In this manner, periodically monitoring the detected value Sd enables diagnosis of the failure of the H sensor 39.

FIG. 11 is a flowchart of a method of failure diagnosis during a period in which the V drive voltage fluctuation width Dv is unchanged.

In S130, the determination unit 53 determines whether a predetermined time ΔT has passed since the previous diagnosis. If the determination made by the determination unit 53 is affirmative, the process proceeds to S131. If the determination made is negative, the process is terminated.

In S131, the voltage fluctuation width detection unit 50 detects and stores the V drive voltage fluctuation width Dv. In S132, the swing angle fluctuation width detection unit 51 detects and stores the H swing angle fluctuation width.

In S133, the determination unit 53 contrasts the V drive voltage fluctuation width Dv of the previous time (the predetermined time ΔT before the current time) with that of the current time. If the determination unit 53 determines that the V drive voltage fluctuation width Dv has not changed (the amount of change is less than the threshold value) between the previous time and the current time, the process proceeds to S134. Conversely, if it is determined to have changed (the amount of change is not less than the threshold value), the process is terminated.

In S134, the calculation determination unit 59 calculates detected values Sdp, Sdn of the previous and current times. In S135, the calculation determination unit 59 contrasts the detected value Sdp of the previous time with the detected value Sdn of the current time.

In S136, the calculation determination unit 59 makes a determination about the output of the H sensor 39 on the basis of the contrast in S135. Specifically, the following Expression 3 is used, in which Cth3 is a threshold value and is set as a positive predetermined value.

$$\text{Detected value } Sdp - \text{Detected value } Sdn \leq Cth3 \quad \text{(Expression 3)}$$

If the Expression 3 is satisfied, the H sensor 39 is determined to be free of failure; otherwise, the H sensor 39 is determined to have a failure.

(Modifications)

In the light deflector 30 of the embodiment, the first axis (resonant axis) and the second axis (non-resonant axis) around which the mirror unit 31 reciprocatingly turns intersect in an orthogonal relationship at the center O of the mirror unit 31. The relationship between the first and second axes of the present invention is not limited to the orthogonal relationship, as long as the axes are in an intersecting relationship.

In the embodiment, the H sensor 39 is provided as a built-in sensor of the light deflector 30 by using the piezoelectric layer of the MEMS light deflector 30. In the present invention, the swing angle fluctuation width detection unit which detects the swing angle fluctuation width on the first axis side can also be configured with a photo detector (PD) or the like placed outside the light deflector 30. In this case, the PD (not limited to a single PD; it may include a plurality of PDs arranged in a row along the scanning trajectory) operates, for example, to receive a scanning light beam Ls when the beam comes near an end of its scanning range and detect a maximum or minimum first axis side swing angle of the mirror unit 31 and its timing.

In FIG. 5, the V drive voltage of the V actuator 35 has a sawtooth waveform. For the V drive voltage of the present invention, waveforms other than the sawtooth waveform (e.g., triangular wave and sine wave) can also be adopted.

In S108 of the embodiment, the abnormality of the V swing state is determined on the basis of the Expression 2. In the present invention, the abnormality of the V swing state can also be determined on the basis of a difference in the following Expression 4, instead of the ratio in the Expression 2. In the Expression 4, Cth4 is a positive, predetermined threshold value.

(Detected value $Sd1$–Detected value $Sd2$)–(Rated value $Sr1$–Rated value $Sr2$)≤$Cth4$   (Expression 4)

What is claimed is:

1. An light deflection device comprising:
   an light deflector having a mirror unit, a first piezoelectric actuator configured to cause the mirror unit to reciprocatingly turn around a first axis resonantly, and a second piezoelectric actuator configured to cause the mirror unit to reciprocatingly turn around a second axis non-resonantly, the second axis being in an intersecting relationship with the first axis;
   a drive unit configured to supply a first drive voltage and a second drive voltage to the first piezoelectric actuator and the second piezoelectric actuator, respectively, of the light deflector;
   a voltage fluctuation width detection unit configured to detect a second drive voltage fluctuation width;
   a swing angle fluctuation width detection unit configured to detect a first swing angle fluctuation width as a fluctuation width of a swing angle of the mirror unit around the first axis;
   a sensitivity equivalent value detection unit configured to detect a sensitivity equivalent value on the basis of a detected value of the second drive voltage fluctuation width and a detected value of the first swing angle fluctuation width, the sensitivity equivalent value being a ratio of the first swing angle fluctuation width to the second drive voltage fluctuation width; and
   a determination unit configured to determine whether a second axis side swing state of the mirror unit around the second axis is normal, on the basis of a detected value of the sensitivity equivalent value.

2. The light deflection device according to claim 1, wherein
   the determination unit includes
   a data holding unit which holds data that defines a rated relationship between the second drive voltage fluctuation width and a rated value of the sensitivity equivalent value, and
   a calculation determination unit configured to calculate a corresponding rated value of the sensitivity equivalent value corresponding to a detected value of the second drive voltage fluctuation width on the basis of the rated relationship, and determine the second axis side swing state on the basis of a contrast between the detected value of the sensitivity equivalent value and the corresponding rated value of the sensitivity equivalent value.

3. The light deflection device according to claim 2, wherein
   with first and second conditions being set as conditions that cause the light deflector to operate with mutually different fluctuation widths Vw1 and Vw2, respectively, of the second drive voltage fluctuation width,
   the calculation determination unit performs the contrast, using a detected value Sd1 of the sensitivity equivalent value under the first condition and a corresponding rated value Sr1 corresponding to the fluctuation width Vw1, and a detected value Sd2 of the sensitivity equivalent value under the second condition and a corresponding rated value Sr2 corresponding to the fluctuation width Vw2, by contrasting a relative relationship between the detected value Sd1 and the detected value Sd2 with a relative relationship between the corresponding rated value Sr1 and the corresponding rated value Sr2.

4. The light deflection device according to claim 3, wherein
   the calculation determination unit performs the contrast between the relative relationships by contrasting a ratio of Sd1 to Sd2 with a ratio of Sr1 to Sr2.

5. The light deflection device according to claim 3, wherein
   the calculation determination unit performs the contrast between the relative relationships by contrasting a difference between Sd1 and Sd2 with a difference between Sr1 and Sr2.

6. The light deflection device according to claim 3, wherein
   the fluctuation width Vw1 under the first condition is a non-customizable second axis side voltage fluctuation width at the time of startup of the light deflector, and
   the fluctuation width Vw2 under the second condition is a customizable second axis side voltage fluctuation width changed at a first change after the startup.

7. The light deflection device according to claim 3, wherein
   the fluctuation width Vw1 under the first condition and the fluctuation width Vw2 under the second condition are the second drive voltage fluctuation widths before and after the second drive voltage fluctuation width is changed while a first drive voltage fluctuation width as a fluctuation width of the first drive voltage is maintained.

8. The light deflection device according to claim 1, wherein
   the determination unit determines that the swing angle fluctuation width detection unit is in a failure state in the case where the detected value of the sensitivity equivalent value has changed by more than a predetermined threshold value during a period in which the second drive voltage fluctuation width is kept constant.

* * * * *